US012077846B2

(12) United States Patent
Anderson et al.

(10) Patent No.: US 12,077,846 B2
(45) Date of Patent: Sep. 3, 2024

(54) APPARATUS AND METHODS OF SUBLIMATION FOR REPEATABLE UNIFORM OR PATTERNED DEPOSITION OF MATRIX CRYSTALS ON SOLID SUBSTRATES

(71) Applicant: VANDERBILT UNIVERSITY

(72) Inventors: David Anderson, Nashville, TN (US); Eric Spivey, Nashville, TN (US); Richard Caprioli, Nashville, TN (US)

(73) Assignee: VANDERBILT UNIVERSITY, Nashville, TN (US)

( * ) Notice: Subject to any disclaimer, the term of this patent is extended or adjusted under 35 U.S.C. 154(b) by 514 days.

(21) Appl. No.: 16/698,311

(22) Filed: Nov. 27, 2019

(65) Prior Publication Data

US 2020/0181758 A1  Jun. 11, 2020

Related U.S. Application Data

(60) Provisional application No. 62/774,555, filed on Dec. 3, 2018.

(51) Int. Cl.
 C23C 14/24 (2006.01)
 C23C 14/04 (2006.01)
 C23C 14/50 (2006.01)

(52) U.S. Cl.
 CPC ............. *C23C 14/24* (2013.01); *C23C 14/04* (2013.01); *C23C 14/50* (2013.01); *C23C 14/243* (2013.01)

(58) Field of Classification Search
 None
 See application file for complete search history.

(56) References Cited

U.S. PATENT DOCUMENTS

| 2003/0033978 A1* | 2/2003 | Zhao ............... C23C 16/4402 118/724 |
| 2005/0178334 A1* | 8/2005 | Shinma ............ C23C 16/4581 118/725 |
| 2008/0268137 A1* | 10/2008 | Ikeda ................ H01L 51/001 204/192.1 |
| 2010/0090099 A1* | 4/2010 | Chen ................ H01J 49/0004 250/288 |

FOREIGN PATENT DOCUMENTS

JP  2001335920 A  * 12/2001

OTHER PUBLICATIONS

Hankin et al., "Sublimation as a method of matrix application for mass spectrometric imaging," *J Am Soc Mass Spectrom*, 18(9):1646-52, 2007.
Sato et al., "Metabolomic changes in the mouse retina after optic nerve injury," *Scientific Reports*, 8(1):11930, 2018.
"HTX Sublimator", downloaded from http://www.htximaging.com/copy-of-sublimator-for-asms on Jun. 11, 2021.

* cited by examiner

*Primary Examiner* — David P Turocy
(74) *Attorney, Agent, or Firm* — Parker Highlander PLLC

(57) ABSTRACT

This disclosure relates to apparatus and methods for sublimation and deposition of chemicals. In particular aspects, this disclosure relates to apparatus and methods for patterned sublimation and deposition of chemicals for use in matrix assisted laser desorption ionization imaging mass spectrometry (MALDI IMS). In specific aspects, the apparatus comprises a vacuum chamber and a template comprising a planar surface containing the chemical to be sublimed, where the template is located within the vacuum chamber.

13 Claims, 4 Drawing Sheets

APPARATUS AND METHODS OF SUBLIMATION FOR REPEATABLE UNIFORM OR PATTERNED DEPOSITION OF MATRIX CRYSTALS ON SOLID SUBSTRATES

CROSS-REFERENCE TO RELATED APPLICATIONS

This application claims priority to U.S. Provisional Patent Application Ser. No. 62/774,555, filed Dec. 3, 2018, the entire contents of which are incorporated herein by reference.

The invention was made with government support under Grant No. 5P41 GM103391-08 awarded by the National Institutes of Health and the National Institute of General Medical Sciences. The government has certain rights in the invention.

BACKGROUND

A. Field

This disclosure relates to apparatus and methods for sublimation and deposition of chemicals. In particular aspects, this disclosure relates to apparatus and methods for sublimation and deposition of chemicals for use in matrix assisted laser desorption ionization imaging mass spectrometry (MALDI IMS).

B. Related Art

The controlled sublimation and deposition of chemicals can be useful in numerous applications, including for example, MALDI IMS. MALDI IMS is an analytical technique with tremendous potential in biotechnology, due to the sensitivity and specificity with which mass spectrometry can identify discrete biochemicals. In order for this potential to be fully recognized, however, the spatial resolution of MALDI IMS images needs to improve.

MALDI IMS has been utilized to image the distribution of analytes including drugs, lipids, metabolites and proteins with increasing higher spatial resolutions. As the technology rapidly progresses with sample preparation techniques providing improved sensitivity from smaller laser footprints, the desire for smaller and smaller crystal sizes is increasing. Spatial resolution of MALDI IMS data is limited in part by the crystal size of the matrix deposited on the sample.

Conventional methods of applying matrix such as automated sprayers and spotting devices are fundamentally limited by the droplet size and volume of aerosol solvated matrix solution accelerated towards the sample surface. Sublimation was previously introduced as a method of purifying the matrix applied to the sample, removing the need for solvation of the matrix and reducing the crystal size formed on tissue sections. Embodiments of the present disclosure include a sublimation apparatus that can potentially reduce the crystal size of matrix that can be deposited on substrates of interest to biomedical researchers and provide patterned sublimation and deposition of the chemical. Such embodiments can potentially be used to achieve high spatial resolution MALDI IMS.

Typical sublimation and coating apparatus, although capable of producing a homogenous coating, often resulted in variable amounts deposited from user to user and from day to day. This variability can be observed as varying crystal size and thickness of matrix on the sample, which negatively affects the mass spectrometer experimental settings from experiment to experiment.

Commercial alternatives to the typical apparatus are expensive, take considerable time to perform experiments, and cannot produce submicron crystals. Accordingly, improved sublimation and coating apparatus and methods are desired.

SUMMARY

Briefly, the present disclosure provides apparatus, systems and methods for the sublimation and deposition of chemicals. In certain embodiments, the chemicals are sublimated from a patterned template and deposited onto a substrate that can be used in matrix assisted laser desorption ionization imaging mass spectrometry (MALDI IMS). Exemplary embodiments allow highly controlled, repeatable deposition of matrix crystals onto multiple solid substrates without the use of motion control devices. In addition, exemplary embodiments provide for deposition of submicron-sized matrix crystals.

Certain embodiments include an apparatus for sublimation and deposition of a chemical, where the apparatus comprises: a vacuum chamber where in operation the chamber is below atmospheric pressure; a template comprising a planar surface containing the chemical to be sublimed, wherein the template is located within the vacuum chamber; a heating element configured to heat the template and sublimate the chemical on the planar surface of the template; a substrate retaining device; and a surface in contact with the substrate retaining device. In particular embodiments, the substrate retaining device is located within the vacuum chamber; the surface in contact with the substrate retaining device is held at a lower temperature than the template when the template is heated by the heating element; and the substrate retaining device is configured to position a substrate such that compound sublimated from the planar surface of the template can be deposited on the substrate.

In some embodiments, the template is a patterned template. In specific embodiments, the planar surface comprises a plurality of recessed portions; the recessed portions are distributed across the planar surface in a pattern; and the recessed portions are configured to contain the chemical. In some embodiments, the planar surface comprises a textured surface. In certain embodiments, the patterned template comprises a fabric impregnated with the chemical. In particular embodiments, the chemical is a matrix material configured for matrix assisted laser desorption ionization imaging mass spectrometry (MALDI IMS). In some embodiments, the patterned template comprises a pattern that is a uniformly spaced distribution across the planar surface. In specific embodiments, the patterned template comprises a pattern that is a non-uniformly spaced distribution across the planar surface. In certain embodiments, the patterned template comprises a pattern that is a gradient spaced distribution across the planar surface, such that the minimum spacing between recessed portions on a first section of the planar surface is less than the minimum spacing between recessed portions on a second section of the planar surface. In particular embodiments, the planar surface of the template is an insert placed into a pan structure. In some embodiments, the planar surface of the template is a base of a pan structure.

In specific embodiments, the vacuum chamber comprises an upper assembly sealed to a lower assembly, and the upper assembly comprises a cooling block with a heat exchange well; the cooling block is formed from a metal; and the heat exchange well contains a coolant. In certain embodiments, the metal has a thermal conductivity greater than 200 Watts per meter-Kelvin (W/m K). In particular embodiments, the coolant is cooled liquid. In some embodiments, the cooled liquid is ice water, dry ice in acetone, or liquid nitrogen. In specific embodiments, the coolant is a solid heat sink. In certain embodiments, the coolant is a heat exchanger. In particular embodiments, the coolant is a powered cooling device. Certain embodiments further comprise a heat distribution plate, wherein the heat distribution plate is positioned between the heating element and the planar surface of the template. Particular embodiments further comprise an insulator plate positioned such that the heating element is located between the insulator plate and the heat distribution plate. In some embodiments, the substrate retaining device is configured to position and hold the substrate. In specific embodiments, the substrate retaining device is configured to position and hold a plurality of substrates. In certain embodiments, the plurality of substrates comprises microscope slides that are each three inches long and one inch wide.

Particular embodiments include a method of sublimating and depositing a chemical, where the method comprises: placing the chemical into a plurality of recessed portions on a planar surface, wherein the recessed portions are distributed across the planar surface in a pattern; positioning the planar surface in a vacuum chamber; positioning a substrate in the vacuum chamber; heating the chemical in the plurality of recessed portions on the planar surface; reducing the pressure in the vacuum chamber; sublimating the chemical from the plurality of recessed portions; and depositing the chemical onto the substrate.

In some embodiments, the chemical is deposited onto the substrate in a deposition pattern that corresponds to the pattern of recessed portions distributed across the planar surface. In specific embodiments, the chemical comprises matrix materials for matrix assisted laser desorption ionization imaging mass spectrometry (MALDI IMS). In certain embodiments, the chemicals deposited on substrate form submicron crystals. In particular embodiments, the deposition pattern is a uniformly spaced distribution across the planar surface. In some embodiments, the deposition pattern is a non-uniformly spaced distribution across the planar surface. In specific embodiments, the deposition pattern is a gradient spaced distribution across the planar surface, such that the minimum spacing between recessed portions on a first section of the planar surface is less than the minimum spacing between recessed portions on a second section of the planar surface. Certain embodiments further comprise inserting the planar surface of the into a pan structure. In particular embodiments, the planar surface of the template is a base of a pan structure. In some embodiments, the vacuum chamber comprises an upper assembly sealed to a lower assembly; the upper assembly comprises a cooling block with a heat exchange well; and the method further comprises placing a coolant in the heat exchange well.

Any embodiment of any of the present methods, composition, kit, and systems may consist of or consist essentially of—rather than comprise/include/contain/have—the described steps and/or features. Thus, in any of the claims, the term "consisting of" or "consisting essentially of" may be substituted for any of the open-ended linking verbs recited above, in order to change the scope of a given claim from what it would otherwise be using the open-ended linking verb.

The use of the term "or" in the claims is used to mean "and/or" unless explicitly indicated to refer to alternatives only or the alternatives are mutually exclusive, although the disclosure supports a definition that refers to only alternatives and "and/or."

Throughout this application, the term "about" or "approximately" is used to indicate that a value includes the standard deviation of error for the device or method being employed to determine the value.

Following long-standing patent law, the words "a" and "an," when used in conjunction with the word "comprising" in the claims or specification, denotes one or more, unless specifically noted.

The terms "sublimate", "sublimation" and variations thereof are used to refer to a process by which a solid chemical transitions to a gas phase, accomplished by heating at vacuum.

The terms "deposit", "deposition" and variations thereof are used to refer to a process by which a gaseous chemical transitions to a solid phase by crystalizing at vacuum onto a cooled substrate.

The term "matrix" is used to refer to a specific kind of chemical used in imaging mass spectrometry, which must be sublimated onto a sample for the sample to be imaged.

The term "substrate" is used to refer to a cooled, solid surface on which chemicals can be deposited as crystals, and may contain a sample for deposition of matrix.

The term "sample" is used to refer to a material to be imaged via imaging mass spectrometry, which may be affixed to a substrate for deposition of matrix.

The term "template" is used to refer to a device for patterning a chemical prior to sublimation. The pattern is translated during sublimation and deposition as crystals in a comparable pattern on the substrate(s). Some template patterns can be designed to deposit a uniform covering of crystals.

The term "coolant" is used to refer to a substance or device that cools the sample. Although in current use the coolant is primarily a liquid, this term is used as a general term to cover other coolants such as a solid heat sink, heat exchanger, or powered cooling device.

Other objects, features and advantages of the present invention will become apparent from the following detailed description. It should be understood, however, that the detailed description and the specific examples, while indicating certain embodiments of the invention, are given by way of illustration only, since various changes and modifications within the spirit and scope of the invention will become apparent to those skilled in the art from this detailed description.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF THE INVENTION

Exemplary embodiments of the present disclosure include apparatus and methods to sublimate and contain chemicals in vapor phase, then to allow deposition of the chemicals onto a solid substrate that can then be removed from the invention.

Sublimation is a process that utilizes the simultaneous application of vacuum and heat to a chemical to transition it from solid phase directly to gas phase. Deposition is a process that returns a chemical to solid phase from gas phase, and requires cooling of the desired deposition surface in the presence of the chemical in the gas phase. Embodiments of the present invention comprise a vacuum chamber, a heating unit, a patterned template, a cooling block, and a substrate retaining device.

In one embodiment of the invention, the chemicals used are matrix materials for matrix assisted laser desorption ionization imaging mass spectrometry (MALDI IMS), and the substrate is a sample of biological origin.

Figure 1:
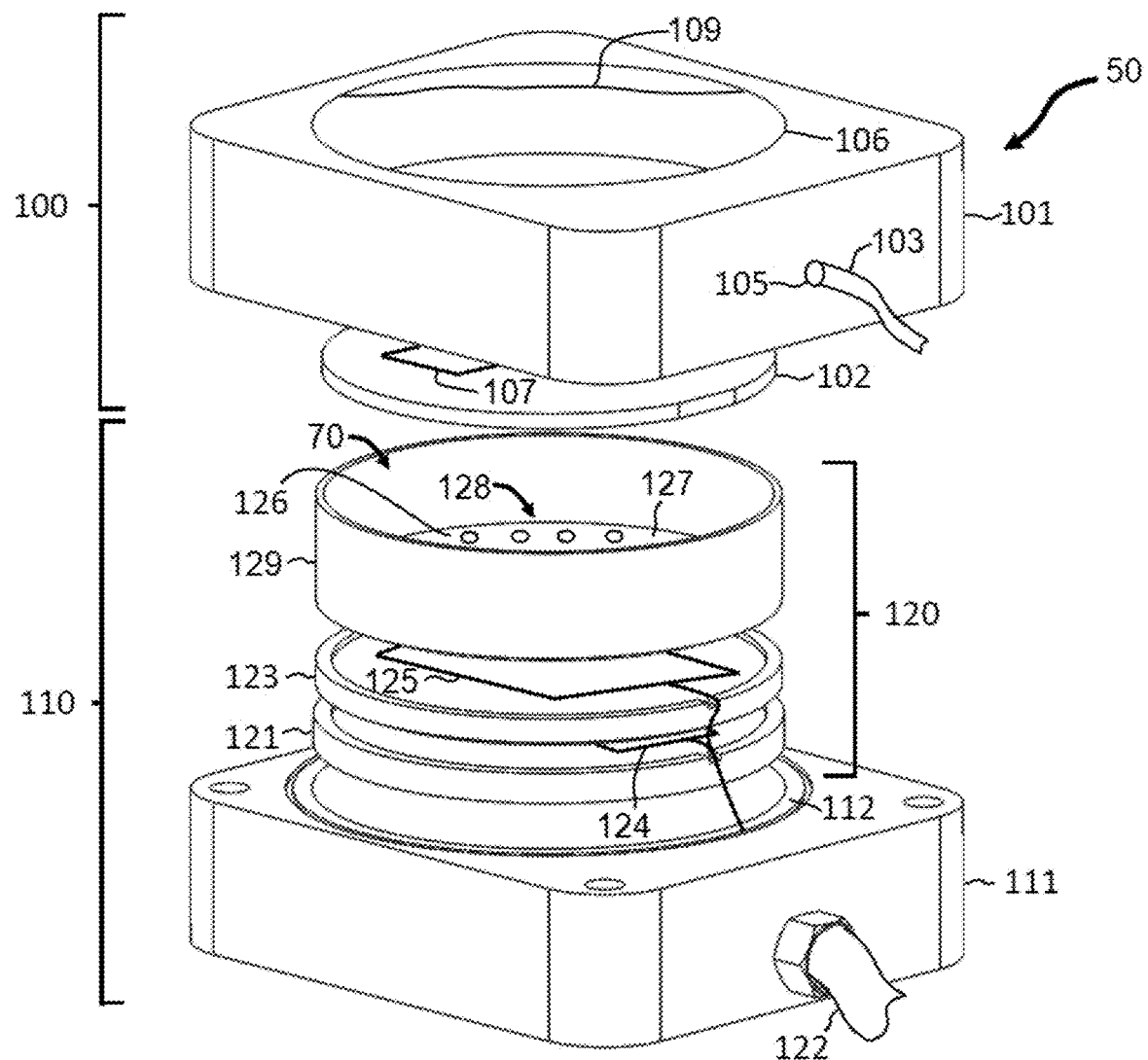
FIG. 1 is an exploded perspective view of an apparatus according to a first exemplary embodiment of the present disclosure.

Referring initially to FIG. 1, an exploded view of an apparatus 50 is shown. Apparatus 50 is configured for sublimation and deposition of matrix crystals, as further explained below. In this embodiment, apparatus 50 includes a vacuum chamber 70 formed by an upper assembly 100 sealed to a lower assembly 110. It is understood that the designations "upper" and "lower" are provided for ease of reference to the drawings in the included figures, and is not intended to be a limitation regarding the orientation of exemplary embodiments of the present invention.

An overview of the components and operation of apparatus 50 will be provided initially, followed by more detailed discussion of the various aspects. In general, upper and lower assemblies 100 and 110 can be sealed together, and an externally applied vacuum applied. The applied vacuum can reach the low pressures required for sublimation and deposition of many chemicals, including those commonly used for matrix in MALDI IMS. The chemicals can be heated in lower assembly 110 to the point of sublimation and deposited on a substrate located in upper assembly 100. In exemplary embodiments, a template in lower assembly 110 can be used to position the chemicals in a desired pattern for deposition on the substrate in upper assembly 100.

In the illustrated embodiment, lower assembly 110 comprises a base 111, a heating element 120, and a seal 112 to seal lower assembly 110 to upper assembly 100. In particular embodiments, seal 112 may be configured as an O-ring 112. In the embodiments shown, lower assembly 110 of apparatus 50 further comprises a template 126 with a planar surface 127 having a plurality of recessed portions 128 configured to retain the chemicals. In certain embodiments, recessed portions 128 may be configured as semi-spherical dimples or other suitable structural features, such as cylindrical or funnel-shaped recesses. It is understood that the recessed portions and other features shown in the figures are not to scale, and may be represented schematically for clarity.

In exemplary embodiments, the plurality of recessed portions 128 are distributed across planar surface 127 in a specific pattern that provides a desired deposition arrangement on the substrate. For example, recessed portions 128 may be uniformly distributed across planar surface 127 in a uniform pattern. As discussed further below, other embodiments may comprise different patterns of recessed portions 128 and the resulting deposition of chemicals on the substrate. In certain embodiments, template 126 can be divided into different sections to provide the ability to sublimate multiple chemicals during one operation cycle of the invention. In the embodiment shown in FIG. 1, template 126 is also configured with a planar surface 127 as a base with walls 129 extending from surface 127 to form a hollow cylindrical structure (e.g. forming a pan or dish). Also discussed further below, template 126 may be configured as a separate component retained in a pan structure.

In the embodiment shown, heating unit 120 comprises a heat distribution plate 123, a thermocouple 124, and a heating element 125 (e.g. a flat polyimide heater in some embodiments). An electrical conduit 122 provides power and feedback for the electrical components in heating unit 120. In certain embodiments, lower assembly 111 is a closed assembly and contains an insulator plate 121 positioned such that heating element 125 is located between heat distribution plate 123 and planar surface 127 of template 126.

In the illustrated embodiment, upper assembly 100 comprises a cooling block 101, a substrate retaining device 102, and a port 105 coupled to a vacuum line 103 with a valve 104 (not shown) for manual or automated control of the vacuum pressure. Substrate retaining device 102 can be configured to position one or more substrates 107. In addition, cooling block 101 comprises a heat-exchange well 106 that contains a coolant 109 (e.g. a liquid mixture or other suitable substance) to reduce the temperature of cooling block 101, substrate retaining device 102 and substrate 107. In some embodiments, the coolant may be ice water, dry ice in acetone, or liquid nitrogen, and in particular embodiments, cooling block 101 may be formed from a metal with thermal conductivity greater than 200 Watts per meter-Kelvin (W/m K), including for example, aluminum. Heat-exchange well 106 of cooling block 101 provides a surface in contact with substrate retaining device 102, where the surface in contact with substrate retaining device 102 is held at a lower temperature than the template when the template is heated by the heating element 125.

During operation of apparatus 50, heating element 125 increases the temperature of heat distribution plate 123, template 126, and the chemicals located within recessed portions 128. In addition, a vacuum is created within apparatus 50 via vacuum line 103. The increased temperature of the chemicals in recessed portions 128 and reduced pressure within apparatus 50 sublimate the chemicals from recessed portions 128. As the chemicals are sublimated from recessed portions 128, the chemical gases move upward toward substrate 107. The reduced temperature of substrate 107 results in the chemicals being deposited on substrate 107. Exemplary embodiments of the present disclosure are capable of depositing submicron-sized matrix crystals (e.g. crystals in which the largest dimension is less than one micron) due to the controlled and repeatable environment in which the sublimation and deposition is performed.

Figure 2:
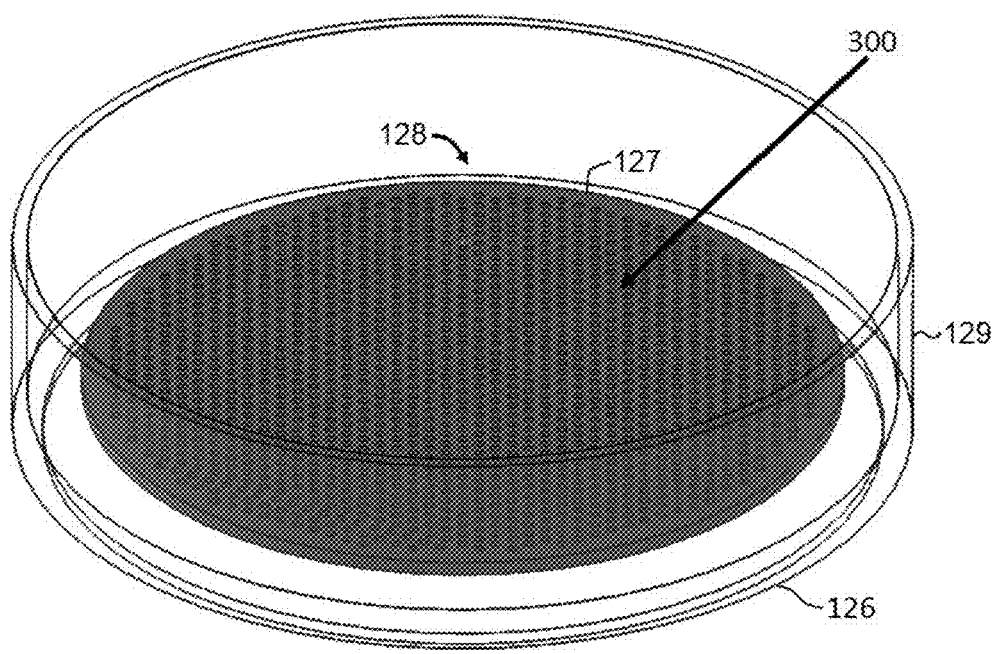
FIG. 2 is a perspective view of a first template configured for use in the embodiment of FIG. 1.
Figure 3:
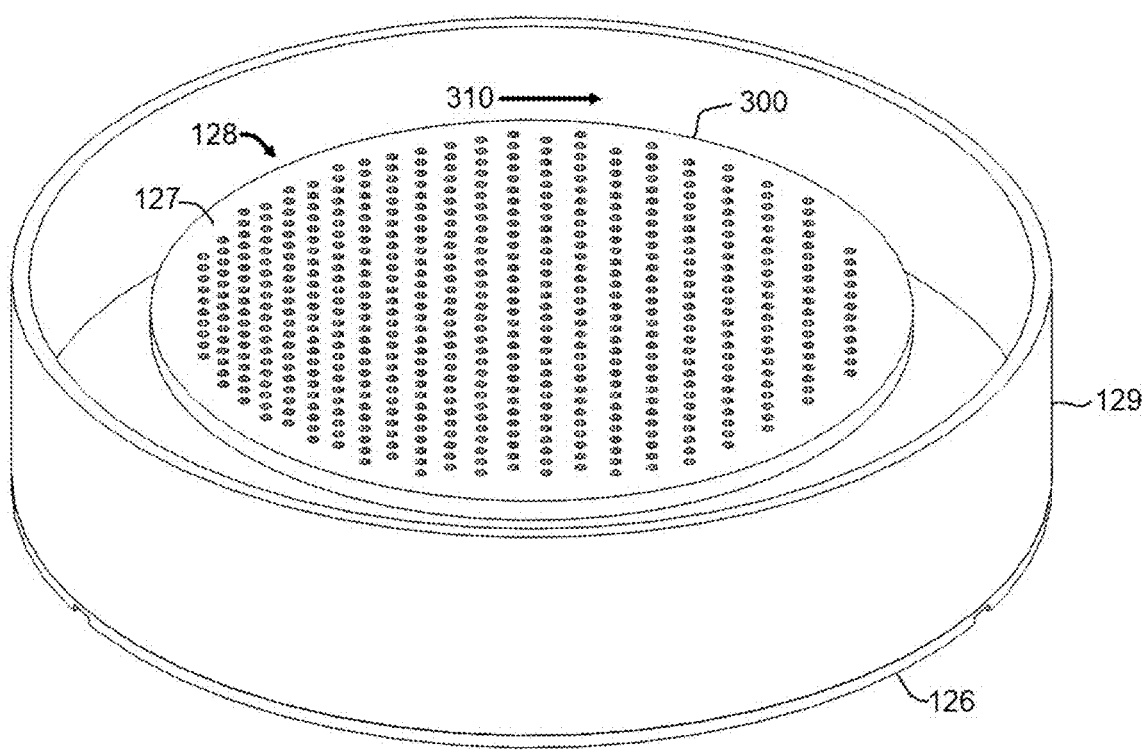
FIG. 3 is a perspective view of a second template configured for use in the embodiment of FIG. 1.

Referring now to FIG. 2, a perspective view is shown of another configuration for template 126. In this embodiment, planar surface 127 with recessed portions 128 is a separate insert 300 located within walls 129. This can allow different inserts with different patterns to be placed within walls 129. For example, referring now to FIG. 3, insert 300 comprises recessed portions 128 distributed in a pattern that is a gradient spaced distribution across planar surface 127. As shown in FIG. 3, as the distribution of recessed portions 128 moves across planar surface 127 in the direction of arrow 310, the minimum spacing between recessed portions 128 is increased. Accordingly, for the section of template 126 toward the left in FIG. 3, the minimum spacing (e.g. the distance between a particular recessed portion 128 and the nearest recessed portion 128) is less than the minimum spacing between recessed portions on the right section of template 126. This can affect the resulting deposition pattern on substrate 107 shown in FIG. 1. For example, more of the chemical will be deposited on the left side of substrate 107 (e.g. the side of substrate 107 that is positioned proximal to the left side of template 126) than will be distributed on the right side of substrate 107. This results from the fact that there is a greater volume of the chemical on the left section of template 126 due to the closer spacing of the recessed portion on the left section of template 126. Accordingly, the arrangement of the recessed portions on the template provides for a deposition pattern of the chemical on the substrate that corresponds to the pattern of the recessed portions on the template.

While linear rows of recessed portions 128 are shown in FIGS. 2 and 3, it is understood that other patterns may be used in other embodiments. For example, concentric circles, ellipses, squares or other polygons may be used in some templates. Still other embodiments may comprise templates with any desired pattern configuration, and the scope of the present invention is not limited to the examples shown and described.

Apparatus 50 provides substantial benefits over typical sublimation and deposition apparatus and methods. For example, template 126 provides the ability to control the deposition pattern of the chemicals on substrate 107. This can provide important benefits when the user does not desire a uniform distribution of the chemical or chemicals across a substrate. An example of where this can be useful is when it is desirable to process multiple substrates with different biological samples requiring different densities of matrix for optimal imaging. In addition, the use of recessed portions 128 can allow more precise volume control of the chemical (s) being sublimated. This can reduce waste of chemicals and increase the operating efficiency of the sublimation and deposition process. In addition, multiple templates can be prepared ahead of time to speed up sublimation process.

Figure 4:
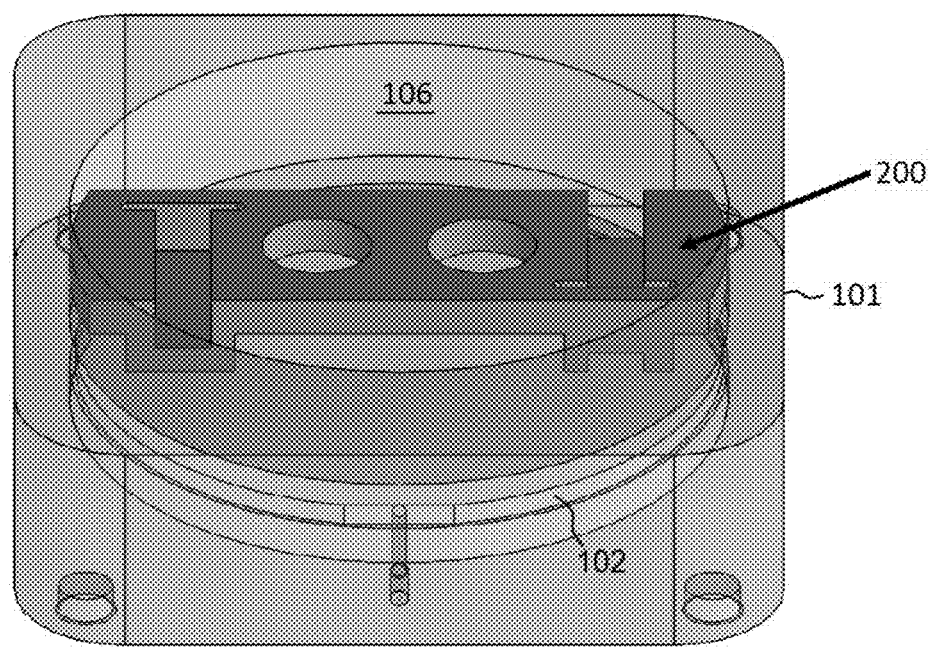
FIG. 4 is a view of a substrate retaining device held in contact with the cooling block via a magnetic retainer for use in the embodiment of FIG. 1.

In some embodiments, the coolant liquid can be replaced with a solid coolant (heat sink) or a heat exchanger. In certain embodiments, substrate retaining device 102 is a heat conducting plate that immobilizes the substrate during deposition, and cools the substrate via contact with the cooling block 101. In one embodiment of the invention, the substrate retaining device 102 accommodates four substrates that are configured as standard 3"×1" microscope slides. Referring now to the embodiment shown FIG. 4, substrate retaining device 102 is held in contact with cooling block 101 via a magnetic retainer 200 placed in heat-exchange well 106.

Figure 5:
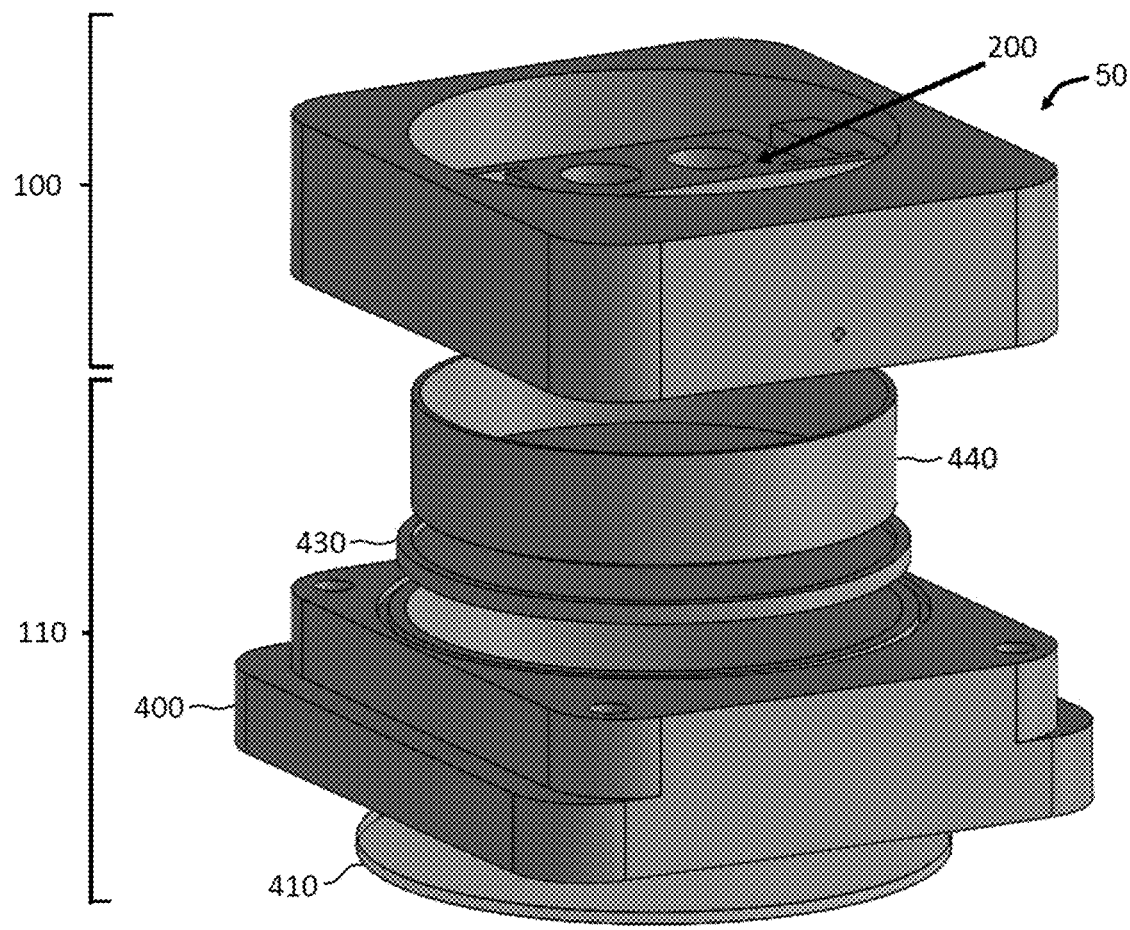
FIG. 5 is an exploded perspective view of an apparatus according to a second exemplary embodiment of the present disclosure.

Referring now to FIG. 5, an embodiment of apparatus 50 operates in a manner similar to the embodiment shown in FIG. 1, but with some variation in components and operating principles. For sake of clarity, some components that are equivalent to that of the embodiment of FIG. 1 are not labeled in FIG. 5. It is understood that unlabeled components are generally equivalent to those of FIG. 1.

In the embodiment shown in FIG. 5, lower assembly 110 comprises a base 400 that is open and sits on an induction heater. A non-metallic vacuum window 410 supports a bottom sealing member (e.g. O-ring, not visible in the view shown) on which base 400 rests, and which seals the vacuum chamber. An insulator 430 rests on vacuum window 410 and supports a magnetic pan 440 that is heated via induction. In some embodiments, insulator 430 is a pan, but it may also be embodied as one or more smaller components (e.g. a ring, discs, bearings, etc.). In other aspects, the embodiment shown in FIG. 5 is equivalent to that of previously-described embodiments. For example, templates with desired patterns of recessed portions can be inserted into magnetic pan 440 to create the desired deposition pattern on substrates retained via magnetic retainer 200 in upper assembly 100.

EXAMPLES

The following examples are included to demonstrate preferred embodiments of the disclosure. It should be appreciated by those of skill in the art that the techniques disclosed in the examples which follow represent techniques discovered by the inventor to function well in the practice of the disclosure, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the disclosure.

Initial experiments using A glass sublimation device have shown that cooling of the samples below 0° C. with dry ice and acetone results in significantly smaller crystals. However, repeated drastic temperature variations on a glass device subjected to low pressure (mTorr value) causes fatigue, increasing the risk of implosion and substantially lowering the expected lifespan of the device.

An improved vessel was constructed using machined aluminum billet allowing fast and more drastic temperature variations for cooling of sample temperature and safe operation, allowing a user to cool samples with dry ice and acetone and liquid nitrogen. This functionally can provide sub 1-micron crystal sizes from multiple matrices allowing for higher spatial resolution experiments to be performed with greater sensitivity. A temperature-controlled heating element is also incorporated inside the vessel which ramps at the same rate for each experiment and provides a faster deposition without requiring a hot plate to be left on constantly or lengthy cooling of the device before the vessel can be opened.

Moderate heating of the upper vessel chamber after deposition, before breaking vacuum, prevents condensation on the sample surface when exposed to atmospheric humidity upon opening the vessel, which can negatively affect crystal size. The effective sampling area is large enough to accommodate four microscope slides which can be coated consistently and rapidly in one experiment. Conventional apparatus are typically only able to accommodate one microscope slide and take substantially longer to obtain a coating. The design of the interior of the vessel prevents fluctuations of airflow across the sample area while under vacuum by forming a curtain, shielding the samples and preventing airflow variations, and allowing matrix amounts deposited at each location to be reproducible.

In addition, the design on the matrix well removes potential human error and time taken to weigh out the matrix to be deposited. Furthermore, by using a set amount of doped matrix with each experiment the amount required to deposit the desired amount is much less than the conventional vessel and commercially available technology.

All of the methods disclosed and claimed herein can be made and executed without undue experimentation in light of the present disclosure. While the compositions and methods of this invention have been described in terms of preferred embodiments, it will be apparent to those of skill in the art that variations may be applied to the methods and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

V. REFERENCES

The following references, to the extent that they provide exemplary procedural or other details supplementary to those set forth herein, are specifically incorporated herein by reference.

Hankin et al., Sublimation as a method of matrix application for mass spectrometric imaging. J Am Soc Mass Spectrom. 2007 September; 18(9):1646-52. Epub 2007 Jun. 30.

Sato et al., Metabolomic changes in the mouse retina after optic nerve injury. Scientific Reports 8, 11930. 2018

U.S. Patent Publication 2010/0090099.

http://www.htximaging.com/copy-of-sublimator-for-asms

What is claimed:

1. An apparatus for sublimation and deposition of a chemical, the apparatus comprising:
    a vacuum chamber where in operation the chamber is below atmospheric pressure;
    a template comprising a planar surface containing the chemical to be sublimed, wherein the template is located within the vacuum chamber;
    a heating element configured to heat the template and sublimate the chemical on the planar surface of the template;
    a substrate retaining device; and
    a surface in contact with the substrate retaining device, wherein:
        the substrate retaining device is located within the vacuum chamber;
        the surface in contact with the substrate retaining device is held at a lower temperature than the template when the template is heated by the heating element;
        the substrate retaining device is configured to position a substrate such that compound sublimated from the planar surface of the template can be deposited on the substrate;
        the template is a patterned template;
        the planar surface comprises a plurality of recessed portions;
        the recessed portions are distributed across the planar surface in a pattern;
        the recessed portions are configured to contain the chemical;
        the arrangement of the recessed portions on the template provides for a deposition pattern of the chemical on the substrate that corresponds to the pattern of the recessed portions on the template;
        the vacuum chamber comprises an upper assembly sealed to a lower assembly;
        the upper assembly comprises a cooling block with a heat exchange well;
        the heat exchange well is external to the vacuum chamber;
        the cooling block is formed from a metal;
        the heat exchange well contains a coolant; and
        the heat exchange well is in contact with the substrate retaining device.

2. The apparatus of claim 1 wherein the planar surface comprises a textured surface.

3. The apparatus of claim 1 wherein the patterned template comprises a fabric impregnated with the chemical.

4. The apparatus of claim 1 wherein the chemical is a matrix material configured for matrix assisted laser desorption ionization imaging mass spectrometry (MALDI IMS).

5. The apparatus of claim 1 wherein the patterned template comprises a pattern that is a uniformly spaced distribution across the planar surface.

6. The apparatus of claim 1 wherein the patterned template comprises a pattern that is a non-uniformly spaced distribution across the planar surface.

7. The apparatus of claim 6 wherein the patterned template comprises a pattern that is a gradient spaced distribution across the planar surface, such that the minimum spacing between recessed portions on a first section of the planar surface is less than the minimum spacing between recessed portions on a second section of the planar surface.

8. The apparatus of claim 1 wherein the metal has a thermal conductivity greater than 200 Watts per meter-Kelvin (W/m K).

9. The apparatus of claim 1 wherein the coolant is cooled liquid, a solid heat sink, a heat exchanger, or a powered cooling device.

10. The apparatus of claim 1 further comprising a heat distribution plate, wherein the heat distribution plate is positioned between the heating element and the planar surface of the template.

11. The apparatus of claim 10 further comprising an insulator plate positioned such that the heating element is located between the insulator plate and the heat distribution plate.

12. The apparatus of claim 1 wherein the substrate retaining device is configured to position and hold the substrate.

13. The apparatus of claim 12 wherein the substrate retaining device is configured to position and hold a plurality of substrates.

* * * * *